(12) United States Patent
De Padova

(10) Patent No.: US 9,048,844 B2
(45) Date of Patent: Jun. 2, 2015

(54) METHOD AND SYSTEM FOR CONTROLLING AND STABILISING THE FREQUENCY OF A SIGNAL GENERATED BY A CONTROLLABLE OSCILLATOR

(75) Inventor: Ignazio De Padova, Monteporzio Catone (IT)

(73) Assignee: ONETASTIC S.R.L., Brescia (IT)

( * ) Notice: Subject to any disclaimer, the term of this patent is extended or adjusted under 35 U.S.C. 154(b) by 92 days.

(21) Appl. No.: 14/003,198

(22) PCT Filed: Mar. 16, 2012

(86) PCT No.: PCT/IB2012/051287
§ 371 (c)(1),
(2), (4) Date: Sep. 4, 2013

(87) PCT Pub. No.: WO2012/127395
PCT Pub. Date: Sep. 27, 2012

(65) Prior Publication Data
US 2013/0342278 A1 Dec. 26, 2013

(30) Foreign Application Priority Data
Mar. 24, 2011 (IT) .................................. TO11A0254

(51) Int. Cl.
*H03L 7/00* (2006.01)
*H03K 3/011* (2006.01)
*H03L 1/02* (2006.01)

(52) U.S. Cl.
CPC *H03L 7/00* (2013.01); *H03K 3/011* (2013.01); *H03L 1/022* (2013.01)

(58) Field of Classification Search
CPC ........................................................ H03L 7/00
USPC ............ 331/34, 70, 175, 176, 182, 183, 185, 331/186; 327/156–158
See application file for complete search history.

(56) References Cited

U.S. PATENT DOCUMENTS 3,617,955 A 11/1971 Masland
4,293,830 A 10/1981 Accatino
(Continued)

OTHER PUBLICATIONS
International Search Report dated May 8, 2012, issued in PCT Application No. PCT/IB2012/051287, filed Mar. 16, 2012.
(Continued)

*Primary Examiner* — Joseph Chang
*Assistant Examiner* — Jeffrey Shin
(74) *Attorney, Agent, or Firm* — Workman Nydegger

(57) ABSTRACT

A method and a system are described for controlling and stabilizing in time, as temperature changes, the frequency of a signal generated by a controllable oscillator (3), the method includes the steps of: measuring the frequency of the signal generated by the controllable oscillator (3) by using a first signal, whose duration is proportional to the length of a delay line (5) includes at least a first (7) and a second (9) delay line portions arranged in series and having a first (L1) and a second (L2) lengths, respectively; applying a frequency correction to the signal generated by the controllable oscillator (3) if the difference in frequency between the signal and the desired frequency value exceeds a predetermined threshold; providing the first portion of the delay line (5) by coupling a conductive material to a first dielectric material having a first negative gradient of its dielectric constant as a function of temperature; providing the second portion (9) of the delay line (5) by coupling or another conductive material to a second dielectric material having a second negative gradient of its dielectric constant as a function of temperature, the absolute value of the second gradient being greater than that of the first gradient; selecting the second length (L2) of the second delay line portion (9) in a manner such that the relation $L_2=(L_1 \cdot \Delta R_1)/\text{abs}(\Delta R_2)$ is true, wherein $\Delta R_1$ and $\Delta R_2$ represent, respectively, a first and a second delay variations introduced by the first (7) and the second (9) line portions, and wherein said first delay variation ($\Delta R_1$) is smaller, for each Kelvin degree, than the thermal expansion coefficient of or another conductive material.

15 Claims, 1 Drawing Sheet

(56) References Cited

U.S. PATENT DOCUMENTS 6,327,318 B1* 12/2001 Bhullar et al. ............... 375/374
7,619,486 B1 11/2009 Lesea
2006/0273836 A1* 12/2006 Lin .............................. 327/158
2007/0079166 A1 4/2007 Okada et al.
2008/0100391 A1 5/2008 Lim et al.

OTHER PUBLICATIONS

International Preliminary Report on Patentability and Written Opinion dated Sep. 24, 2013, issued in PCT Application No. PCT/IB2012/051287, filed Mar. 16, 2012.

* cited by examiner

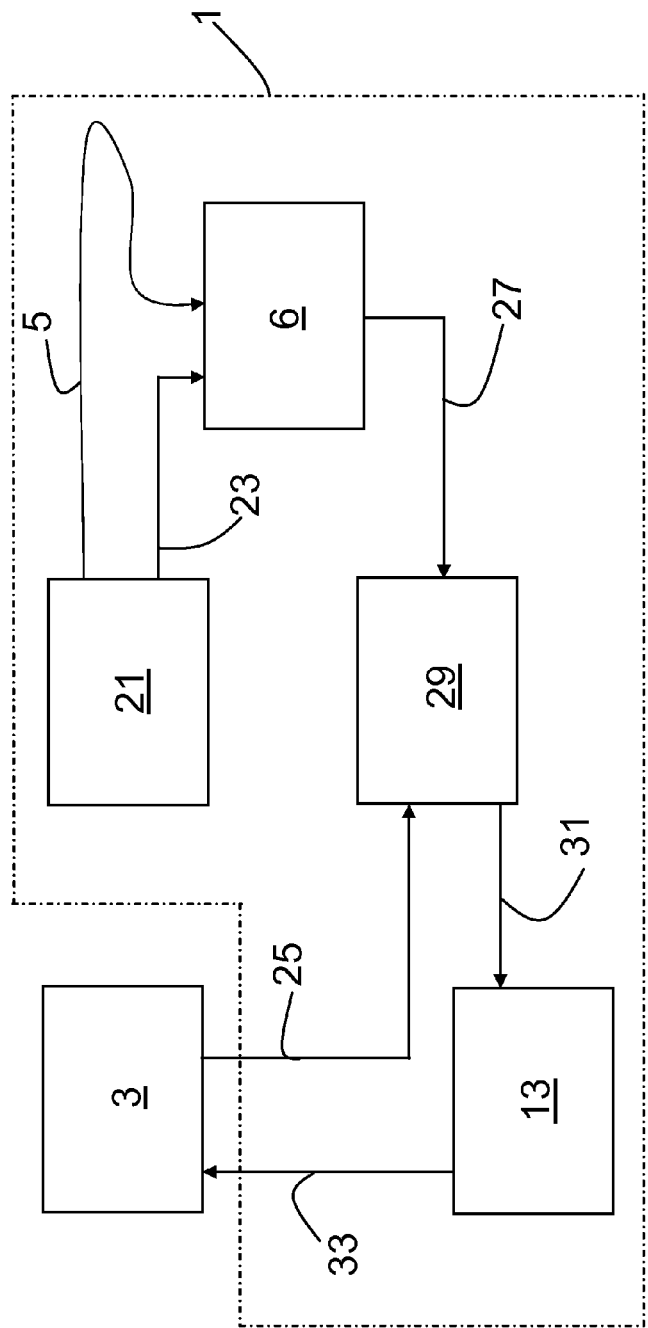
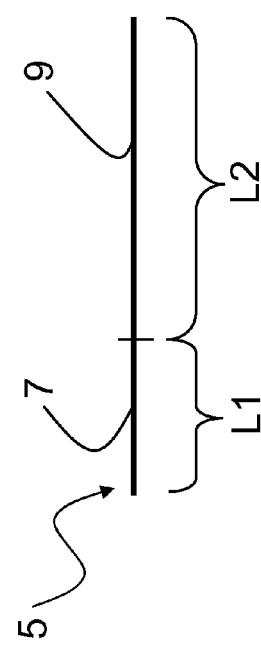

METHOD AND SYSTEM FOR CONTROLLING AND STABILISING THE FREQUENCY OF A SIGNAL GENERATED BY A CONTROLLABLE OSCILLATOR

BACKGROUND OF THE INVENTION

1. Field of the Invention

The present invention relates to a method and a system for controlling and stabilizing the frequency of a signal generated by an oscillator.

More in particular, the present invention relates to a method and a system for controlling and stabilizing the frequency of a signal generated by a controllable oscillator as temperature changes, so that the oscillation frequency remains extremely stable.

2. Present State of the Art

It is known that many electronic applications require the use of an oscillator, which must be extremely stable in frequency.

For example, one application that requires the use of oscillators being extremely stable in frequency is the broadcasting of the DVB-T digital terrestrial television signal in "SFN" mode, i.e. in a Single Frequency Network, in order to synchronize in frequency transmitters belonging to the same network.

This requirement is typically fulfilled in three different ways:
1) by using metrologic-grade oscillators, e.g. cesium, rubidium and similar units;
2) by using oscillators controllable through an external reference, even if the external reference is at a different frequency than that which must be generated by the oscillator: for example, this category includes oscillators using, as a reference signal, the "1PPS" ("One Pulse Per Second") signal of GPS ("Global Positioning System");
3) commercial controlled oscillators, e.g. of the "VCXO" ("Voltage Control Crystal Oscillator") or "OCXO" ("Oven-Controlled Crystal Oscillator") types.

Each one of the above-mentioned oscillator typologies has its own drawbacks:
1) metrologic-grade oscillators offer excellent accuracy, but they are very expensive and are therefore not suitable for commercial applications;
2) oscillators controllable through an external reference suffer from at least three drawbacks. First of all, the external reference signal requires the installation of external devices, in particular GPS receivers, of dishomogeneous technology with respect to the technology used in the oscillators, so that reliability problems may arise; secondly, the proper operation of the oscillator depends on the availability of the external reference: if the latter is lost, e.g. due to failures or adverse weather conditions, the oscillator may become completely useless; in the third place, if the source of the absolute reference is a satellite system managed by third parties, such as the GPS system, the proper operation of the oscillator depends on parameters out of the user's control. It is in fact known that the use of the GPS system, or of similar satellite systems, is free: however, it is not possible to enter into service contracts to ensure continuity of service or adequate performance levels. In other words, the GPS system is offered "as is", and may suddenly become unavailable or inadequate or technically insufficient at any time, without the user being allowed to do anything or to raise any objection;
3) commercial controlled oscillators have insufficient accuracy for most applications because, in the absence of an external frequency reference, they typically have a daily frequency drift of a few Hz, i.e. a few hundreds Hz or more per year.

For example, in the above-mentioned case relating to the synchronization of transmitters of a DVB-T network operating in SFN mode, the required accuracy is $10^{-9}$, i.e. the tolerable frequency drift is a few Hz per GHz.

One of the causes that contributes to the frequency drift of the signal generated by an oscillator is the operating temperature thereof.

It is known in the art, e.g. from U.S. Pat. No. 3,617,955 and U.S. Pat. No. 4,293,830, to use delay lines in order to compensate for drifts caused by temperature. However, said patents do not teach to correct with extremely high precision any frequency drifts due to temperature.

SUMMARY OF THE INVENTION

It is therefore one object of the present invention to provide a method and a system for controlling and stabilizing in time the frequency of a signal generated by a controllable oscillator, so as to correct with very high accuracy any frequency drifts caused by temperature.

It is another object of the present invention to provide a method and a system for controlling and stabilizing in time the frequency of a signal generated by a controllable oscillator, so as to generate a signal which is very stable in frequency.

It is a further object of the present invention to provide a method and a system for controlling and stabilizing in time the frequency of a signal generated by a controllable oscillator, so as to require no external reference signals.

It is yet another object of the present invention to provide a method and a system for controlling and stabilizing in time the frequency of a signal generated by a low-cost controllable oscillator.

These and other objects of the invention are achieved through a method and a system for controlling and stabilizing in time the frequency of a signal generated by a controllable oscillator as claimed in the appended claims, which are intended to be an integral part of the present description.

In short, the method for controlling and stabilizing the frequency of a signal generated by a controllable oscillator provides for generating a pulse through a pulse generator and for having the pulse transit through a delay line that comprises at least a first and a second delay line portions arranged in series.

The frequency of the signal generated by the controllable oscillator is measured by using a signal whose duration is proportional to the length of the delay line.

A frequency correction is applied to the signal generated by the controllable oscillator if the difference in frequency between said signal and the desired frequency value exceeds a predetermined threshold.

The first delay line portion is provided by coupling a conductive material to a first dielectric material having a first negative gradient of its dielectric constant as a function of temperature, whereas the second delay line portion is provided by coupling the same or a different conductive material to a second dielectric material having a second negative gradient of its dielectric constant as a function of temperature, wherein the absolute value of the second gradient is greater than that of the first gradient.

The length of the second delay line portion is selected in a manner such that the relation $L_2 = (L_1 \cdot \Delta R_1)/\text{abs}(\Delta R_2)$ is true, where L1 and L2 are, respectively, the length of the first and second delay line portions, and $\Delta R_1$ and $\Delta R_2$ represent, respectively, a first and a second delay variations introduced by the first and second delay line portions for each 1K variation in the temperature at which both delay lines operate.

In this manner, any effects on the accuracy of the frequency drift measurement caused by temperature changes are substantially cancelled, so that it becomes easier to correct with high precision any frequency drifts of the oscillator.

Through an appropriate selection of the conductive material and of the dielectric materials used for manufacturing the at least two delay line portions, it is possible to achieve an accuracy of the order of $10^{-9}$, thus making the system and the method of the present invention susceptible of implementation in applications that require an extremely accurate oscillator, such as, for example, systems for transmitting a digital terrestrial television signal in a single frequency network.

Further features of the invention are set out in the appended claims, which are intended as an integral part of the present description.

BRIEF DESCRIPTION OF THE DRAWINGS

The above objects will become more apparent from the following detailed description of a method and a system for controlling and stabilizing in time the frequency of a signal generated by an oscillator, with particular reference to the annexed drawings, wherein:

FIG. 1 is a diagram of a system for controlling and stabilizing in time the frequency of a signal generated by a controllable oscillator according to the present invention;

FIG. 2 shows in detail a delay line of the system of FIG. 1.

DETAILED DESCRIPTION OF THE PREFERRED EMBODIMENTS

With reference to FIG. 1, there is shown a system 1 for controlling and stabilizing in time the frequency of a signal generated by a controllable oscillator 3, said system 1 comprising a pulse generator 21, a gate generator 6, means 29 for determining the frequency of a signal, in particular a pulse counter, and a frequency correction module 13.

The pulse generator 21 generates a pulse which is simultaneously transmitted to the gate generator 6 through a first line 23 and a delay line 5.

The first line 23 has ideally null length, i.e. a pulse generated by the pulse generator 21 is immediately made available to the gate generator 6, while the same pulse follows an intentionally longer path through the delay line 5.

Therefore, the output of the gate generator 6 is typically a gate-shaped signal 27, i.e. a signal similar to a square wave whose period has, on the above hypothesis, a duration which is proportional to the time taken by the pulse generated by the pulse generator 21 to travel the delay line 5.

In the pulse counter 29, an oscillator signal 25 generated by the oscillator 3 is superimposed on the gate signal 27. Then the number of pulses of the oscillator signal 25 which are present in the gate signal 27 are counted to obtain the frequency of the oscillator signal 25.

If the difference between the frequency of the oscillator signal 25, measured inside the counter 29, and the desired frequency value exceeds a predetermined threshold, which represents the desired accuracy of the oscillation frequency for a certain application, then appropriate information is transmitted by the counter 29, via a second line 31, to the correction module 13. The latter then controls the oscillator 3 by means of a correction signal 33, so as to compensate for the frequency drift of the oscillation signal 25 detected in the counter 29.

It follows that the subsystem that includes the pulse generator 21, the gate generator 26 and the counter 29 constitutes an independent reference for measuring the frequency of the signal generated by the oscillator 3.

For said reference to remain stable over time as temperature changes, it is essential that the period of the gate signal 27 remains stable over time as the operating temperature changes and, as a consequence, that the behaviour of the delay line 5 remains stable over time as the operating temperature changes.

With reference to FIG. 2, there is shown in detail the delay line 5, which comprises at least one first portion 7, having a first length L1, and at least one second portion 9, having a second length L2, made of different materials and arranged in series, as will be explained in more detail below.

In order to be able to obtain a very accurate measurement of the signal generated by the oscillator 3, it is necessary to ensure that the actual and detected duration of the gate signal 27 is ideally constant and repeatable over time.

The constancy of the duration detected by the gate 6 is mainly affected by the duration of the delay introduced by the delay line 5, and hence by its constancy over time as temperature changes.

The simplest delay line is a wired line, wherein a wire or a printed circuit track of known length introduces a delay which is proportional to its length. However, the delay line is made of a physical material having its own thermal expansion coefficient $\lambda$.

For example, copper has a thermal expansion coefficient $\lambda$ equal to approximately 18 ppm/K, i.e. 18 parts per million per Kelvin degree, and therefore a copper line could ensure a maximum accuracy of the order of $10^{-5}$/K, which is not enough for those applications where the signal generated by the oscillator 3 is required to have an extremely high accuracy, e.g. $10^{-9}$.

As the operating temperature changes, the length of the delay line 5 changes as well, thereby altering the measurement of the frequency of the oscillator signal 25 at the counter 29.

The time delay introduced by the delay line 5 is affected not only by the length of the line itself, but also by the dielectric constant $\in_r$, which is also variable with temperature in accordance with a known law, depending on the material employed.

The method of the present invention provides for selecting a first dielectric material A having a negative gradient of its dielectric constant $\in_{rA}$ as a function of temperature.

A first portion 7 of the delay line 5 is thus created by coupling a conductive material M to the first dielectric material A.

By way of non-limiting example, said coupling may be accomplished by using a coaxial cable of conductive material M with at least one insulating sheath made of the first dielectric material A, or by depositing at least one track made of conductive material M, e.g. copper, onto a first substrate, e.g. a strip made of the first dielectric material A.

The first dielectric material A is selected in a manner such that, when joined to the conductive material M, the total variation $\Delta R1$ per length unit and per Kelvin degree of the delay introduced by the first portion 7 of the delay line 5 is positive, but still smaller than the delay variation $\Delta R_M$ that would be obtained by only using the conductive material M (and equal to, for each Kelvin degree, the thermal expansion coefficient $\lambda$ of the conductive material M).

The method of the present invention then provides for selecting a second dielectric material B having a negative gradient of its dielectric constant $\in_{rB}$ as a function of temperature, the absolute value of which is however greater than the variation of the dielectric constant $\in_{rA}$ as a function of temperature of the first dielectric material A.

The second dielectric material B is selected in a manner such that, when joined to the conductive material M or to another conductive material, the total variation ΔR2 per length unit and per Kelvin degree of the delay introduced by the second portion 9 of the delay line 5 is negative.

A second portion 9 of the delay line 5 is thus created by coupling the conductive material M to the second dielectric material B.

By way of non-limiting example, said coupling may be accomplished by using a coaxial cable of conductive material M with at least one insulating sheath made of the second dielectric material A, or by depositing at least one track made of conductive material M, e.g. copper, onto a second substrate, e.g. a strip made of the second dielectric material A.

The entire delay line 5, composed of at least a first portion 7 and a second portion 9, is kept within a single environment, and it is therefore assumed that it operates at the same temperature. Based on the above description, the variation per Kelvin degree of the total delay introduced by the first portion 7 of the delay line 5 is equal to L1·ΔR1, whereas the variation per Kelvin degree of the total delay introduced by the second portion 9 of the delay line 5 is equal to L2·ΔR2. In order to keep the delay constant on the delay line 5, it is sufficient to obtain that L1·ΔR1+L2·ΔR2=0.

Since 0<ΔR1<ΔR$_M$ e ΔR2<0, where ΔR$_M$ is the delay variation per length unit and per Kelvin degree of an ideal first portion of the delay line 5 made only of conductive material, the second portion 9 of the delay line 5 is realized in such a way that the second length L2 is equal to:

$$L2=L1·ΔR1/\text{abs}(ΔR2)$$

where "abs" is the absolute value operator.

By arranging the first portion 7 in series with the second portion 9 (which, as aforesaid, operate at the same ambient temperature) to form the delay line 5, one advantageously obtains stability of the delay introduced by the delay line 5 as a function of temperature, because the temperature-dependent variation of the delay introduced by the first portion 7 of the delay line 5 is compensated for by the temperature-dependent variation of the delay introduced by the second portion 9 of the delay line 5.

In a variant of the system according to the invention, it is possible to stabilize the temperature of the oscillator 3, of the delay line 5, of the gate generator 6 and of the counter 29 by means of a thermostat (not shown).

If, for example, said thermostat ensures an accuracy of 0.1 K, then the accuracy of the above-described method will in turn improve by a factor of 10.

The features of the present invention, as well as the advantages thereof, are apparent from the above description.

A first advantage of the present method for stabilizing in time the frequency of a signal generated by a controllable oscillator, and of the system thereof, is that any inaccuracies in the measurement of the signal frequency caused by temperature are virtually cancelled thanks to the particular construction of the delay line, so that it is possible to ensure an extremely high accuracy of the frequency of the signal generated by the oscillator.

A second advantage of the method and system according to the present invention is that the oscillator does not require any external reference signals and does not depend on any third-party technologies.

A further advantage of the method and system according to the present invention is that the cost of implementation of the system is extremely low.

The method for stabilizing in time the frequency of a signal generated by a controllable oscillator and the system thereof described herein by way of example may be subject to many possible variations without departing from the novelty spirit of the inventive idea; it is also clear that in the practical implementation of the invention the illustrated details may have different shapes or be replaced with other technically equivalent elements.

For example, the system and method for controlling and stabilizing in time a signal generated by a controllable oscillator as temperature changes may be employed in order to stabilize the frequency of an oscillator of a transmitter of a single frequency network comprising a plurality of transmitters, such as, for example, a network of transmitters used for broadcasting a digital terrestrial television signal.

It can therefore be easily understood that the present invention is not limited to a method for stabilizing in time the frequency of a signal generated by a controllable oscillator, and a system thereof, but may be subject to many modifications, improvements or replacements of equivalent parts and elements without departing from the inventive idea, as clearly specified in the following claims.

The invention claimed is:

1. A method for controlling and stabilizing in time, as temperature changes, the frequency of a signal generated by a controllable oscillator, said method comprising the steps of:
   measuring the frequency of said signal generated by said controllable oscillator by using a first signal, whose duration is proportional to the length of a delay line comprising at least a first and a second delay line portions arranged in series and having a first (L1) and a second (L2) lengths, respectively;
   applying a frequency correction to said signal generated by said controllable oscillator if the difference in frequency between said signal and the desired frequency value exceeds a predetermined threshold, said method being characterized by:
   providing said first portion of said delay line by coupling a conductive material to a first dielectric material having a first negative gradient of its dielectric constant as a function of temperature;
   providing said second portion of said delay line by coupling said or another conductive material to a second dielectric material having a second negative gradient of its dielectric constant as a function of temperature, the absolute value of said second gradient being greater than that of said first gradient;
   selecting said second length (L2) of said second delay line portion in a manner such that the relation L2=(L1·ΔR1)/abs(ΔR2) is true, wherein ΔR1 and ΔR2 represent, respectively, a first and a second delay variations per Kelvin degree introduced by said first and said second line portions, and wherein said first delay variation (ΔR1) is smaller, for each Kelvin degree, than the thermal expansion coefficient of said or another conductive material.

2. A method according to claim 1, wherein said first portion of said delay line is provided through a coaxial cable made of said conductive material and having at least one insulating sheath made of said first dielectric material.

3. A method according to claim 1, wherein said second portion of said delay line is provided through a coaxial cable made of said conductive material and having at least one insulating sheath made of said second dielectric material.

4. A method according to claim 1, wherein said first portion of said delay line is obtained by depositing at least one track made of said conductive material, in particular copper, onto a first substrate, in particular a first strip, made of said first dielectric material.

5. A method according to claim 1, wherein said second portion of said delay line is obtained by depositing at least one track made of said conductive material, in particular copper, onto a second substrate, in particular a second strip, made of said second dielectric material.

6. A method according to claim 1, wherein said first signal is generated by a gate generator, comprises at least one pulse generated by a pulse generator, and is made to transit through said delay line.

7. A system for controlling and stabilizing in time, as temperature changes, the frequency of a signal generated by a controllable oscillator, said system comprising:
 means for measuring the frequency of said signal generated by said controllable oscillator by using a first signal, whose duration is proportional to the length of said delay line comprising at least a first and a second delay line portions arranged in series and having a first ($L_1$) and a second ($L_2$) lengths, respectively;
 means for applying a frequency correction to said signal generated by said controllable oscillator if the difference in frequency between said signal and the desired frequency value exceeds a predetermined threshold, wherein:
 said first portion of said delay line comprises a conductive material coupled to a first dielectric material having a first negative gradient of its dielectric constant as a function of temperature;
 said second portion of said delay line comprises a conductive material coupled to a second dielectric material having a second negative gradient of its dielectric constant as a function of temperature, the absolute value of said second gradient being greater than that of said first gradient;
 said second length ($L_2$) of said second delay line portion is provided in a manner such that the relation $L_2 = (L_1 \cdot \Delta R_1)/\text{abs}(\Delta R_2)$ is true, wherein $\Delta R_1$ and $\Delta R_2$ represent, respectively, a first and a second delay variations per Kelvin degree introduced by said first and said second line portions, and wherein said first delay variation ($\Delta R_1$) is smaller, for each Kelvin degree, than the thermal expansion coefficient of said or another conductive material.

8. A system according to claim 7, wherein said first portion of said delay line comprises a coaxial cable made of said conductive material and having at least one insulating sheath made of said first dielectric material.

9. A system according to claim 7, wherein said second portion of said delay line comprises a coaxial cable made of said conductive material and having at least one insulating sheath made of said second dielectric material.

10. A system according to claim 7, wherein said first portion of said delay line comprises a first substrate, in particular a first strip, made of said first dielectric material and at least one track made of said conductive material, in particular copper.

11. A system according to claim 7, wherein said second portion of said delay line comprises a second substrate, in particular a second strip, made of said first dielectric material and at least one track made of said conductive material, in particular copper.

12. A system according to claim 7, wherein said first and said second portions of said delay line are arranged in the same environment and operate at the same temperature.

13. A system according to claim 7, wherein said first signal is generated by a gate generator, comprises at least one pulse generated by a pulse generator, and is made to transit through said delay line.

14. A system according to claim 13, wherein said controllable oscillator, said delay line, said gate generator and said means for measuring the frequency of said signal generated by said controllable oscillator are stabilized in temperature by means of a thermostat.

15. A single frequency network comprising a plurality of transmitters, wherein at least one of said transmitters comprises a respective oscillator, wherein said network comprises a system for controlling and stabilizing in time, as temperature changes, the frequency of a signal generated by a controllable oscillator according to claim 7.

* * * * *